United States Patent
Coteus et al.

(10) Patent No.: US 10,531,598 B2
(45) Date of Patent: Jan. 7, 2020

(54) FANS IN SERIES WITH CABLE PLUG INTERFACES

(71) Applicant: International Business Machines Corporation, Armonk, NY (US)

(72) Inventors: Paul W. Coteus, Yorktown, NY (US); Todd Edward Takken, Brewster, NY (US); Shurong Tian, Mount Kisco, NY (US); Yuan Yao, Tarrytown, NY (US); Lisha Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/852,713

(22) Filed: Dec. 22, 2017

(65) Prior Publication Data

US 2019/0200487 A1    Jun. 27, 2019

(51) Int. Cl.
*H05K 7/20* (2006.01)
*H05K 7/14* (2006.01)
*H05K 9/00* (2006.01)

(52) U.S. Cl.
CPC ....... *H05K 7/20727* (2013.01); *H05K 7/1487* (2013.01); *H05K 7/1489* (2013.01); *H05K 7/1491* (2013.01); *H05K 9/0041* (2013.01); *H05K 7/20436* (2013.01)

(58) Field of Classification Search
CPC ............ H05K 7/20727; H05K 7/1491; H05K 7/1487; H05K 7/1489; H05K 9/0041; H05K 7/20436; H05K 7/20136; H05K 7/20145; H05K 7/20172; H05K 7/2019;
(Continued)

(56) References Cited

U.S. PATENT DOCUMENTS 6,072,277 A * 6/2000 Yamamoto ........... B60Q 1/0088
                                                     315/82
6,163,454 A    12/2000 Strickler
(Continued)

FOREIGN PATENT DOCUMENTS

CN    101782797 A    7/2010
CN    105514732 A    4/2016
(Continued)

OTHER PUBLICATIONS

Peter Ross, "Port for cable entry into chassis providing EMI suppression and comprising a compressible conducting seal with a slit", May 30, 2012, CP Cases LTD, Entire Document (Translation of GB 2485780). (Year: 2012).*

*Primary Examiner* — Jayprakash N Gandhi
*Assistant Examiner* — Stephen S Sul
(74) *Attorney, Agent, or Firm* — Harrington & Smith

(57) ABSTRACT

Method for and apparatus were fans and cable placed at the ends at the same end of a computer rack drawer. The cable ends are located between the fans and the computing elements. The bulk length of each cable passes through the region where the fans are located. Air, and optionally EMI, sealing are provided by an elastic material near the fans. In this way cables could exit the same tailstock of the drawer where fans are located. The cable ends can receive good cooling, and the distance between the cable ends and computing elements of the drawer is not lengthened by the fan position.

5 Claims, 5 Drawing Sheets

(58) Field of Classification Search
CPC ............ H05K 7/20736; H05K 7/20718; G02F 1/133385; H01L 23/467
USPC .................................. 361/679.48, 694, 695
See application file for complete search history.

(56) References Cited

U.S. PATENT DOCUMENTS

| | | | |
|---|---|---|---|
| 6,172,416 B1 * | 1/2001 | Miyahara | H01L 23/467 165/122 |
| 6,388,880 B1 | 5/2002 | El-Ghobashy et al. | |
| 6,625,035 B1 * | 9/2003 | Steinman | H05K 7/1409 361/726 |
| 6,826,456 B1 * | 11/2004 | Irving | G06F 1/20 361/695 |
| 7,054,155 B1 * | 5/2006 | Mease | H05K 7/20581 165/104.34 |
| 7,349,208 B2 | 3/2008 | Marumoto | |
| 8,089,754 B2 * | 1/2012 | Peng | H05K 7/20727 312/236 |
| 8,270,171 B2 | 9/2012 | Narasimhan et al. | |
| 8,861,200 B2 | 10/2014 | Malmberg | |
| 9,521,784 B1 | 12/2016 | Huang | |
| 2003/0085050 A1 * | 5/2003 | Zarganis | H05K 7/20181 174/383 |
| 2007/0217910 A1 | 9/2007 | Chang et al. | |
| 2011/0063795 A1 * | 3/2011 | Yeh | G06F 1/182 361/679.48 |
| 2013/0277010 A1 * | 10/2013 | Lin | F24F 13/02 165/80.2 |
| 2016/0037676 A1 * | 2/2016 | Gaal | H05K 7/20572 361/695 |
| 2017/0071063 A1 | 3/2017 | Sizemore | |

FOREIGN PATENT DOCUMENTS

| | | | | |
|---|---|---|---|---|
| CN | 205844993 U | 12/2016 | | |
| GB | 2485780 A | * 5/2012 | ............ | G06F 1/182 |
| JP | 2001196776 A | 7/2001 | | |
| JP | 3251745 B2 | 1/2002 | | |
| KR | 20170080767 A | 7/2017 | | |

* cited by examiner

FANS IN SERIES WITH CABLE PLUG INTERFACES

TECHNICAL FIELD

This invention relates generally to computer rack drawers and, in particular, to such drawers implemented using cooling fans in series with the interfaces for the data cable plugs.

BACKGROUND

This section is intended to provide a background or context to the invention disclosed below. The description herein may include concepts that could be pursued, but are not necessarily ones that have been previously conceived, implemented, or described. Therefore, unless otherwise explicitly indicated herein, what is described in this section is not prior art to the description in this application and is not admitted to be prior art by inclusion in this section.

Traditional designs for computer racks have cables on a single tailstock. If cooling fans are integrated in a drawer, the fans are typically located at the other end of the drawer, the far end from the cable plug and cable exit locations. This is particularly true when the cable ends contain active elements that require cooling.

Limitations of this type of drawer configuration include limiting the number of standard-sized cables that can be used in any given drawer. The typical alternatives would be to employ specially designed cables which would be cost prohibitive or to use double-sized drawers which would then would increase the overall volume of computing equipment, which again could become a cost issue.

In order to double the number of cables per drawer without incurring the costs and other limitations noted above, cables have been arranged on both tailstocks and fans have been arranged inside the drawer between the tailstock and the switch chips or other computing electronics. However, this arrangement increases the distances from the switch chips to the cable ends. In future designs with higher signaling rates such an increase in the distance between the cable ends to switch chip may not be possible because, for instance, of the channel loss problems that arise from longer length of card trace between the cable end and the computing elements inside the drawer.

The current invention moves beyond the current techniques and/or materials.

Abbreviations that may be found in the specification and/or the drawing figures are defined in the text where appropriate.

BRIEF SUMMARY

This section is intended to include examples and is not intended to be limiting. The word "exemplary" as used herein means "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

An example of an embodiment of the present invention is an apparatus with a drawer of computing elements where that drawer has cables with cable ends, plug locations for the cable ends, cooling fans, and computing electronics, where the plug locations of the cable ends, for the cables exiting a drawer of computing electronics, are located in series along an airflow direction between the cooling fans and the computing electronics and the cables exit from the plug locations in the direction of the cooling fans.

DETAILED DESCRIPTION OF THE DRAWINGS

The size and internal complexity of a high port-count switches are determined by the number of cables that can be fit onto a single tailstock. The present invention allows locating cable ends on two tailstocks surrounding a group of switch chips, while keeping the distances from the cable ends to the switch chips short by locating fans outside the ends of the cables. By allowing the cables to exit both ends of a drawer the present invention provides good cooling to all of the cable ends while minimizing the distance between cable ends and active components inside the drawer.

This invention places fans and cable ends at the same end of a drawer. The cable ends are located between the fans and the computing elements. The bulk length of each cable passes through the region where the fans are located. Air, and optionally EMI, sealing are provided by a sealing interface near the fans, most conveniently provided by an elastic material like foam. In this way cables can exit the same tailstock of the drawer where fans are located. The cable ends, which may contain active components, can receive good cooling, and the distance between the cable ends and computing elements of the drawer is not lengthened by the fan position.

The distance between the cable ends and computing elements is usually better kept as short as possible due to electrical signaling requirements. Thus, the current invention looks to not put fans between cable ends and electronics as is done in the prior part preceding this invention but rather to put them farther away from electrical and computing circuits.

Figure 1:
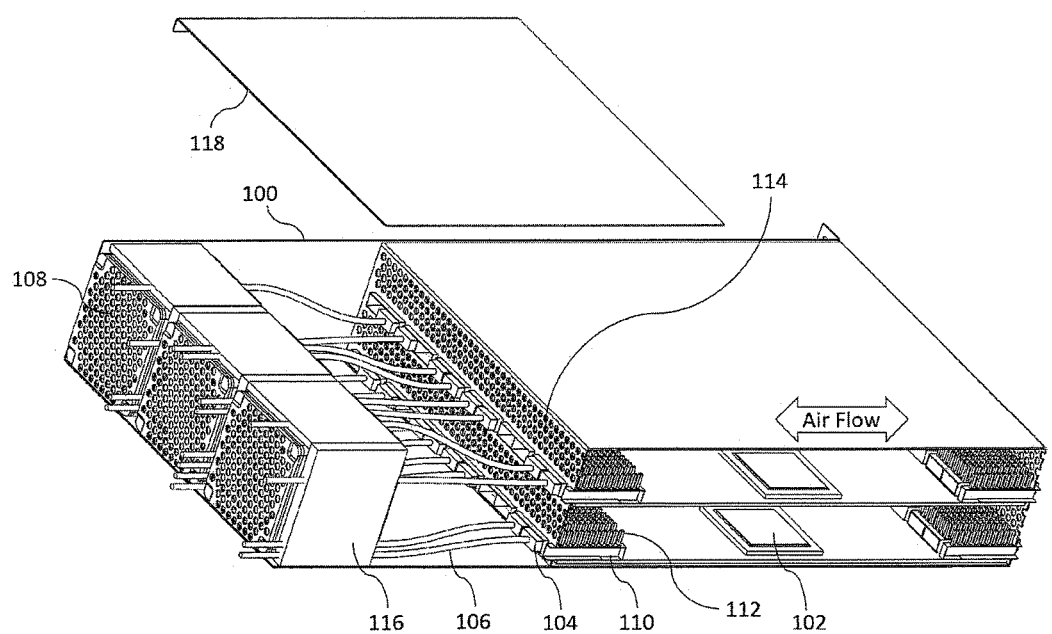
FIG. 1 is a schematic of an exemplary embodiment of an apparatus of the present invention.

FIG. 1 shows a drawer (100) of computing electronics (102) which is a source of signals, in which the plug locations of the cable ends (104) for cables (106) that exit the drawer, are located in series, along the direction of airflow, between the cooling fans (108) and computing elements (102), and the cables exit in the direction of the fans. The fans (108) cool the computing elements (102) inside the drawer and also cool the active cable ends (104) inserted into the cable cages (110), wherein heat sinks (112) are used to help cooling. The sheet metal (114) around the cable cages (110) has holes through it for air flow and provides EMI shielding to the collection of computing elements (106) in the drawer. The fans are in their own EMI enclosure and they are located outside the main EMI shield (114) that surrounds the main computing elements (102). The cables (106) exit the drawer through the gaps around the fans, and sealing materials (116) are used to fill in the gaps to prevent air back flow. A drawer cover (118) is used to prevent air bypassing and back flow. The cables (106) can be plugged or unplugged when the cover (118) is opened. The fans (108) can be serviced easily at the end of the drawer.

Thus, as can be seen from FIG. 1, the EMI shielding the cable air seal are separate and different. Cable (104) passes through the EMI enclosure and exits boundary (114) at the point on the left (106). Thus, air seal (116), since the bulk cable is outside the EMI boundary (114), only has to be an air seal and not an electrical one. And note that there would be multiple such air seals at the fans (108). Moreover, the bulk length of cable does not have to be modified, as can be seen from FIG. 1, such that a standard cable with a plastic or insulating outer sheath can be used without need of modification.

Figure 2:
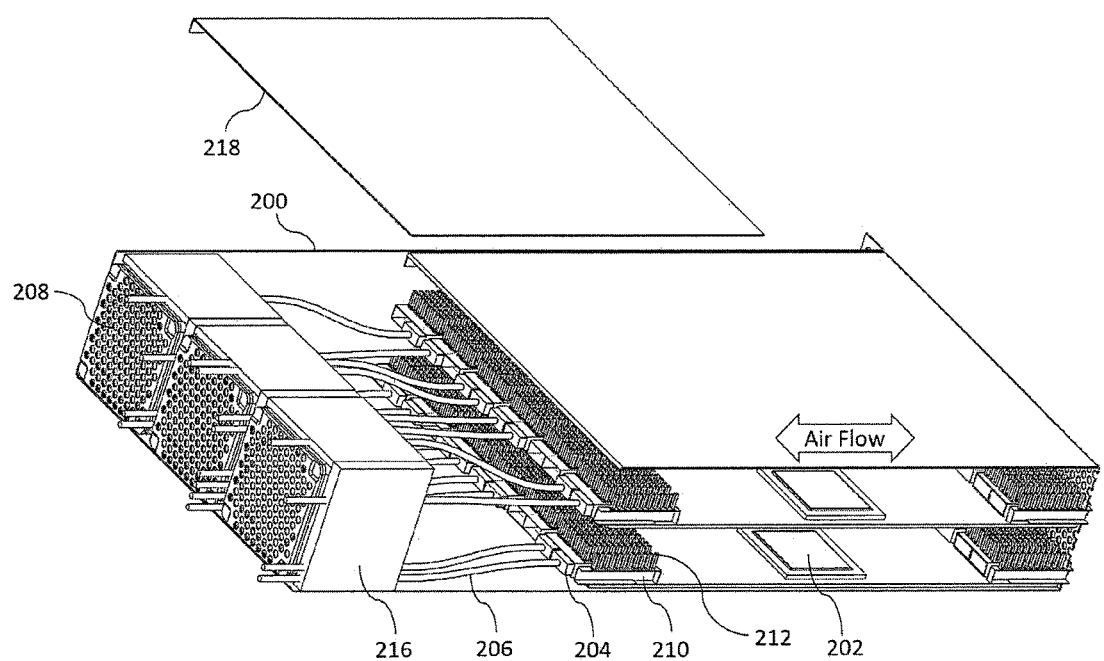
FIG. 2 is a schematic of another exemplary embodiment of an apparatus of the present invention.

In contrast to FIG. 1, in FIG. 2, the EMI shield is on the outside such that an element that would correspond to EMI shield (114) is not depicted. As is discussed below, FIG. 2 has a unified air seal and EMI shield. This could be solution to problems where the cable diameter is different. This solution would be facilitated if the cables could be customized or stripped to expose their electrically conductive ground braid sheath at the point where the cables pass through the unified air and EMI shield. While the exemplary embodiment discussed in FIG. 1 might be enough, there might be electrical preferences for the use of the exemplary embodiment discussed below in FIG. 2 or even financial reasons for preferring one embodiment over the other.

FIG. 2 also shows a drawer (200) of computing electronics (202), in which the plug locations of the cable ends (204) for cables (206) that exit the drawer, are located in series, along the direction of airflow, between the cooling fans (208) and computing elements (202), and the cables exit in the direction of the fans. As in FIG. 1, the fans (208) cool the computing elements (202) inside the drawer and also cool the active cable ends (204) inserted into the cable cages (210), wherein heat sinks (212) are used to help cooling. FIG. 2 differs from FIG. 1 in that the fans are located inside a single EMI shield that is common to the entire drawer. In this case the EMI shield on the outer surface of the fans (208) also forms part of the single EMI enclosure for the entire drawer. The cables (206) exit the drawer (200) through the gaps around the fans. Conducting sealing materials (216) are used to fill in the gaps around the fans to prevent air back flow and to provide EMI sealing around the cables. A drawer cover (218) is used to prevent air by passing and back flow. The cables (206) can be plugged or unplugged when the cover (218) is opened. The fans (208) are arranged along one end of the drawer (200) and can be serviced easily.

In other words, bulk cable (206) goes past fans (208) and seal (216) seals both electromagnetic waves which can cause interference and the air flow.

While seal (116) can be made of any kind of deformable material such as foam, the seal (216), since it seals both electromagnetic waves and airflow, would necessarily have to be made out of a material that can do both. As such, seal (216) can be a metal shield but for easier accessibility to the device a conductive foam would likely work better. Note that the current invention aims to make the process of cooling and sealing more efficient when using so-called off-the-shelf parts. As such, having items made of foam will allow for easier access and easier plugging and unplugging of the standard plugs from the sockets, easier in the sense that cables can be plugged in and out without the need for any special equipment or techniques beyond what is current practice in the industry.

Figure 3:
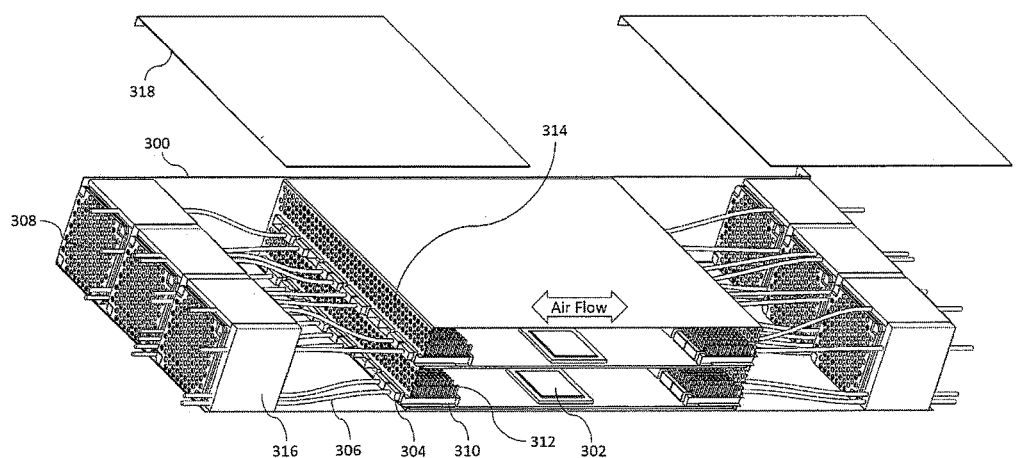
FIG. 3 is a schematic of an additional exemplary embodiment of an apparatus of the present invention.

FIG. 3 is like FIG. 1 but with fans on both tailstocks of the drawer. It shows a drawer (300) of computing electronics (302), wherein on both the upstream and downstream sides of the drawer, the plug locations of the cable ends (304) for cables (306) that exit the drawer, are located in series, along the direction of airflow, between the cooling fans (308) and computing elements (302), and the cables exit in the direction of the fans. The fans (308) cool the computing elements (302) inside the drawer and also cool the active cable ends (304) inserted into the cable cages (310), wherein heat sinks (312) are used to help cooling. The sheet metal (314) around the cable cages (310) has holes through it for air flow and provides EMI shielding to the collection of computing elements (302) in the drawer. The fans are located outside the EMI shield. The cables (306) exit the drawer through the gaps around the fans and sealing materials (316) are used to fill in the gaps to prevent air back flow. Two drawer covers (318) are used to prevent air by passing and back flow. The cables (306) can be plugged or unplugged when the cover (318) is opened. The fans (308) are arranged along both ends of the drawer (300) and can be serviced easily. This design, with fans on both ends, maintains air flow through the drawer when only one of the two covers (318) is opened for either cable plugging or fan servicing.

In contrast to FIG. 1, FIG. 3 has many more cables. In standard industry practice prior to this invention, for such an amount of additional cables, a standard off-the-shelf drawer would have to be twice as tall, so as to have double the amount of cables all with standard plugs and standard cooling, wherein standard is what is in use prior to the current invention. In contrast to such prior practice, FIG. 3, and in particular the instant invention as shown in an exemplary embodiment in FIG. 3, allows the electrical inputs to be kept short by making the cables exit to both sides of the computing electronics which is only available if the fans are arranged as taught by this current disclosure. Thus, an advantage of the current invention is that more ports than a typical switch using chips while using the same off-the-shelf cables but saving rack space is achieved by having the fans in series in the manner described herein.

Moreover, FIG. 3 could also employ the EMI and air seal together as shown in FIG. 2 rather than the separate EMI shield and air blocker of FIG. 1.

Figure 4:
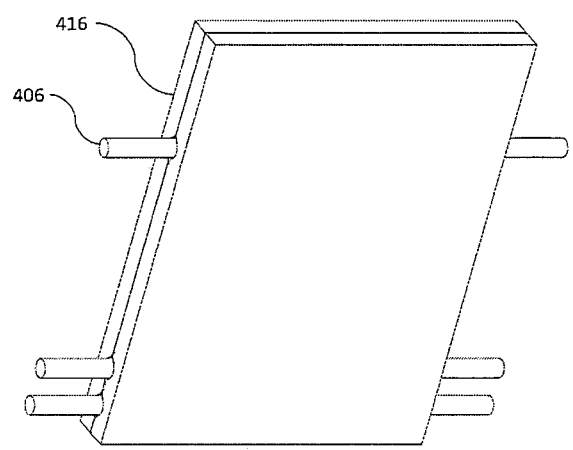
FIG. 4 is a schematic of a feature of a further exemplary embodiment of an apparatus of the present invention.

FIG. 4 shows an air blocker (416) which is formed by two layers of foam material. The air blocker forms an air seal along the length of each cable (406), rather than at the ends of the cables, in order to prevent air recirculation. The cables (406) can be easily removed from the air blocker for installation and servicing. While the air blocker (416) could be made of a simple material to simply block the air flow, it could also be composed together of a material that would block both air flow and EMI. In this latter case, a conductive foam would be an appropriate example of such a material. Although the scope of this invention would also cover air and EMI seals made out of hard, inflexible materials such as shaped, conductive metal pillory blocks into which cables would be inserted, such designs are expected to be less convenient and more expensive to service.

Figure 5:
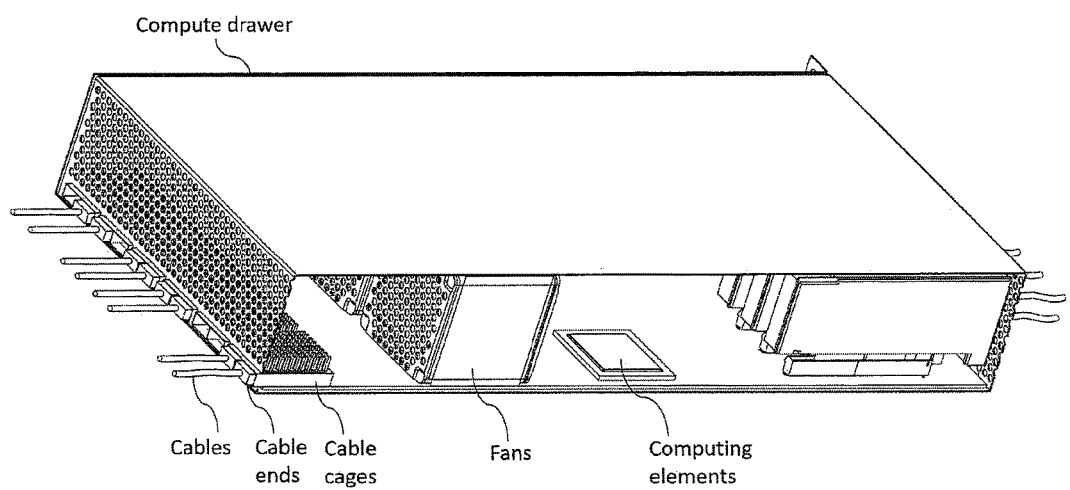
FIG. 5 is a schematic of a computer drawer without the benefit of the present invention.

FIG. 5 shows a compute drawer in which fans are placed between the plug locations of the cable ends and the computing elements. As shown in FIG. 5, in some existing computing drawers fans are placed between the plug locations of the cable ends and the computing elements. This arrangement might increase the distance from the cable ends and the active components with to which the cables are carrying data. The fans in these drawers are also more difficult to service since they are in the middle of the drawers.

Although various aspects of the invention are set out in the independent claims, other aspects of the invention comprise other combinations of features from the described embodiments and/or the dependent claims with the features of the independent claims, and not solely the combinations explicitly set out in the claims.

Without in any way limiting the scope, interpretation, or application of the claims appearing below, an advantage or technical effect of one or more of the exemplary embodiments disclosed herein is ease of servicing a drawer. In order to change a cable, without the present invention, it would be more challenging.

A further advantage or technical effect of one or more of the exemplary embodiments disclosed herein is that it allows more efficient use of space such that with the availability of the arrange of the fans disclosed herein, cables can be easily accessible from both ends of the drawer, meaning that a drawer that otherwise would have had to have been made twice as tall or twice as wide need not be and can maintain the standard off-the-shelf size while allowing for a multiple of the electronic components because of allowing a multiple of cables to access such electronics.

An example of an embodiment, which can be referred to as item 1, is an apparatus that comprises a drawer of computing elements which comprises cables with cable ends; plug locations for the cable ends; cooling fans; and computing electronics; and where the plug locations of the cable ends, for the cables exiting a drawer of computing electronics, are located in series along an airflow direction between the cooling fans and the computing electronics, and where the cables exit from the plug locations in the direction of the cooling fans.

An example of a further embodiment, which can be referred to as item 2, is the apparatus of item 1 where there are no separable connectors along the cables at the point where the cables pass the cooling fans and exit the drawer.

An example of a further embodiment, which can be referred to as item 3, is the apparatus of item 1 further comprising an electromagnetic interference (EMI) shield surrounding at least the computing electronics in the drawer.

An example of a further embodiment, which can be referred to as item 4, is the apparatus of item 3 where the fans are located outside the EMI shield.

An example of a further embodiment, which can be referred to as item 5, is the apparatus of item 3 where the fans are located inside the EMI shield.

An example of a further embodiment, which can be referred to as item 6, is the apparatus of item 5 where the EMI shield is common to the entire drawer.

An example of a further embodiment, which can be referred to as item 7, is the apparatus of item 2 further comprising an air blocker where the air blocker forms an air seal along each of the cables rather than at the cable ends and the air blocker prevents air recirculation beyond the fan.

An example of a further embodiment, which can be referred to as item 8, is the apparatus of item 3 further comprising an air blocker where the air blocker and the EMI shield form both an air and EMI seal each of the cables, rather than at the cable ends, and where the air blocker and EMI shield together prevent both air and electromagnetic radiation beyond the fans.

An example of a further embodiment, which can be referred to as item 9, is the apparatus of item 7 where the air blocker is formed by one or more layers of a deformable material and the cables are easily removable from the air blocker for installation and servicing.

An example of a further embodiment, which can be referred to as item 10, is the apparatus of item 8 where the air blocker and EMI shield are formed together as an air-and-EMI guard by one or more layers of a deformable electrically conductive material, an exterior the cables surrounded by the air-and-EMI guard have an exposed metal shroud, and the deformable electrically conductive material makes both an air and EMI seal to the exterior of the cables.

It is also noted herein that while the above describes examples of embodiments of the invention, these descriptions should not be viewed in a limiting sense. Rather, there are several variations and modifications which may be made without departing from the scope of the present invention as defined in the appended claims.

What is claimed is:

1. An apparatus comprising a drawer of computing elements comprising:
   cables with cable ends;
   plug locations for the cable ends;
   cooling fans;
   computing electronics,
     wherein the plug locations of the cable ends, for the cables exiting a drawer of computing electronics, are located in series along an airflow direction between the cooling fans and the computing electronics, and
     wherein the cables exit from the plug locations in the direction of the cooling fans, and
     wherein the cooling fans are provided on both tailstocks of the drawer;
   a main electromagnetic interference (EMI) shield surrounding at least the computing electronics in the drawer, wherein the fans are located outside the main EMI shield; and
   an air blocker,
     wherein the air blocker forms both an air and EMI seal for each of the cables, rather than at the cable ends, and
     wherein the air blocker prevents both air and electromagnetic radiation beyond the fans, and
     wherein the air blocker is formed as an air-and-EMI guard by one or more layers of deformable electrically conductive material and is held in the drawer between two or more cooling fans.

2. The apparatus of claim 1, wherein there are no separable connectors along the cables at the point where the cables pass the cooling fans and exit the drawer.

3. The apparatus of claim 2,
   wherein the air blocker prevents air recirculation that would bypass the fans.

4. The apparatus of claim 3,
   wherein the cables are easily removable from the air blocker for installation and servicing.

5. The apparatus of claim 1,
   wherein the deformable electrically conductive material makes both an air and EMI seal to the exterior of the cables.

* * * * *